(12) United States Patent
Ahn et al.

(10) Patent No.: US 8,367,281 B2
(45) Date of Patent: Feb. 5, 2013

(54) METHOD OF EXPOSING SUBSTRATE, APPARATUS FOR PERFORMING THE SAME, AND METHOD OF MANUFACTURING DISPLAY SUBSTRATE USING THE SAME

(75) Inventors: Bo-Kyoung Ahn, Incheon (KR); Gug-Rae Jo, Asan-si (KR); Hong-Suk Yoo, Anyang-si (KR); Chang-Hoon Kim, Asan-si (KR); Min-Uk Kim, Seongnam-si (KR); Joo-Han Bae, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 372 days.

(21) Appl. No.: 12/778,574

(22) Filed: May 12, 2010

(65) Prior Publication Data
US 2010/0261105 A1 Oct. 14, 2010

(30) Foreign Application Priority Data
Dec. 4, 2009 (KR) .............................. 2009-0119736

(51) Int. Cl.
G03F 7/20 (2006.01)
G02B 5/20 (2006.01)
(52) U.S. Cl. ................................ 430/7; 430/322; 355/71
(58) Field of Classification Search .................... None
See application file for complete search history.

(56) References Cited

U.S. PATENT DOCUMENTS
6,396,567 B1 * 5/2002 Chu et al. ........................ 355/69
2008/0107972 A1 5/2008 Yamayoshi FOREIGN PATENT DOCUMENTS
| JP | 06-260391 | | 9/1994 |
|---|---|---|---|
| JP | 2005-252161 | | 9/2005 |
| JP | 2009-141263 | | 6/2006 |
| JP | 2008-153402 | | 7/2008 |
| JP | 2008-185730 A | * | 8/2008 |
| KR | 10-2001-0047286 | | 6/2001 |
| KR | 10-2007-0019609 | | 2/2007 |
| KR | 10-2007-0100963 | | 10/2007 |
| KR | 10-0871788 | | 12/2008 |

OTHER PUBLICATIONS

Computer-generated translation of JP 2008-185730 (Aug. 2008).*
English Abstract for Publication No. 06-260391, (Sep. 1994).
English Abstract for Publication No. 10-2001-0047286, (Jun. 2001).
English Abstract for Publication No. 2005-252161, (Sep. 2005).
English Abstract for Publication No. 10-2007-0019609, (Feb. 2007).
English Abstract for Publication No. 10-2007-0100963, (Oct. 2007).
English Abstract for Publication No. 10-2004-0035008 (for 10-0871788), (Apr. 2004).
English Abstract for Publication No. 2008-153402, (Jul. 2008).
English Abstract for Publication No. 2009-141263, (Jun. 2006).

* cited by examiner

*Primary Examiner* — John A. McPherson
(74) *Attorney, Agent, or Firm* — F. Chau & Associates, LLC

(57) ABSTRACT

A photoresist layer exposed through first slits of a mask is exposed using first light. The photoresist layer exposed through second slits of the mask is exposed by using second light. The first light passes thorough a transflective shutter to generate the second light.

20 Claims, 9 Drawing Sheets

METHOD OF EXPOSING SUBSTRATE, APPARATUS FOR PERFORMING THE SAME, AND METHOD OF MANUFACTURING DISPLAY SUBSTRATE USING THE SAME

CROSS-REFERENCE TO RELATED APPLICATION

This application claims priority under 35 USC §119 to Korean Patent Application No. 2009-119736, filed on Dec. 4, 2009 in the Korean Intellectual Property Office (KIPO), the contents of which are herein incorporated by reference in their entirety.

BACKGROUND OF THE INVENTION

1. Field of the Invention

Exemplary embodiments of the present invention relate to a method of exposing a substrate, an apparatus for performing the method and a method of manufacturing a display substrate using the method.

2. Description of Related Art

Generally, a Liquid Crystal Display (LCD) device includes an LCD panel including a Thin-Film Transistor (TFT) substrate, a color filter substrate facing the TFT substrate, and a liquid crystal layer disposed between the TFT substrate and the color filter substrate.

The TFT substrate and the color filter substrate include multiple layers manufactured using a photolithographic process, an exposing process and a developing process.

The exposing process is performed by irradiating light on a photoresist layer formed on a substrate through a separate photo mask having a pattern. The light passing through the photo mask reacts with the photoresist layer of the substrate so that the photoresist layer is patterned according to the pattern formed in the photo mask.

As a size of the LCD device has increased, a size of an irradiation area and a size of a photo mask have remained comparatively small. Thus, the exposing process is performed by scanning a substrate divided into a plurality of exposing areas using a plurality of exposure elements.

However, separate masks may be needed for forming the pattern having the multiple layers, and thus a manufacturing cost of the mask and an exposing apparatus having the mask may increase.

SUMMARY OF THE INVENTION

According to an exemplary embodiment of the present invention, a method of exposing a substrate includes exposing a photoresist layer exposed through first slits of a mask using first light, and the photoresist layer exposed through second slits of the mask using second light. The first light passes through a transflective shutter to generate the second light.

The substrate may be transferred in a first direction, so that the substrate is disposed under the mask and an alignment pattern of the mask is aligned corresponding to an initial alignment pattern of the substrate.

Blocking plates of a blocking shutter disposed over the mask may be unfolded in the first direction or in a direction opposite to the first direction to selectively block the first slit and the second slit corresponding to a region of the substrate to be unexposed.

The blocking plates may be folded with each other to expose the first slit and the second slit corresponding to a region to be exposed.

The transflective shutter may include a plurality of transflective plates, each of the transflective plates has a longitudinal side along a second direction substantially perpendicular to the first direction, and the transflective plates may be unfolded.

The mask and the transflective shutter may be transferred together in an exposing direction, so that the substrate is disposed under the mask and an alignment pattern of the mask is aligned corresponding to an initial alignment pattern of the substrate.

According to another exemplary embodiment of the present invention, an apparatus for exposing a substrate includes a mask, a transflective shutter and a stage. The mask includes first slits and second slits, is the mask disposed over the substrate having a photoresist layer formed on the substrate. The transflective shutter is disposed over the second slits of the mask, and partially transmits first light to generate second light. The stage may change a position of the substrate with respect to the mask.

The stage may transfers the substrate in a first direction to dispose the substrate under the mask.

The transflective shutter may include a plurality of transflective plates connected to each other, and each of the transflective plates may have a longitudinal side in a second direction substantially perpendicular to the first direction.

A transmissivity of the transflective shutter may be in a range between about 5% and about 95%.

The apparatus may further include a blocking shutter disposed between the transflective shutter and the mask to selectively block the first light and the second light.

The blocking shutter may include a plurality of blocking plates connected to each other, and each of the blocking plates may have a longitudinal side in a second direction substantially perpendicular to the first direction.

The mask may include a first area in which the first slits are formed and a second area in which the second slits are formed, and each of the first slits and each of the second slits in a boundary portion between the first and second areas may be connected to each other.

The mask may include a third area in which third slits are formed and a fourth area in which fourth slits are formed, and each of the third slits and each of the fourth slits in a boundary portion between the third and fourth areas may be connected to each other.

The mask may include an alignment pattern corresponding to an alignment pattern of the substrate to align the mask and the substrate.

The stage may transfer the mask and the transflective shutter in an exposing direction of the substrate to dispose the substrate under the mask.

According to still another exemplary embodiment of the present invention, a method of manufacturing a display substrate includes forming a blocking pattern on a substrate including a reflective area and a transmissive area. A color photoresist layer is formed on the substrate having the blocking pattern formed on the substrate. The color photoresist layer in the transmissive area and the color photoresist layer in the reflective area are respectively exposed by using first light and second light, so as to form a color filter having different thickness in the reflective area and in the transmissive area, respectively. In this case, the first light passes through a transflective shutter to generate the second light. A transparent electrode is formed on the substrate on which the color filter is formed.

The substrate may further be step exposed or scan exposed at different positions of the substrate with respect to the mask.

The substrate may be transferred with aligning an alignment pattern of the mask with the blocking pattern of the substrate when the substrate is step exposed or scan exposed.

A blocking shutter may be partially open or closed to selectively block the first light and the second light corresponding to a region of the substrate to be unexposed.

According to some exemplary embodiments of the present invention, an amount of light irradiated to a substrate may be adjusted per area by disposing a transflective shutter over a mask of an apparatus for exposing the substrate. Therefore, a manufacturing step for a slit mask or a half-tone mask is not needed.

BRIEF DESCRIPTION OF THE DRAWINGS

The present invention will become more apparent by describing in detailed exemplary embodiments thereof with reference to the accompanying drawings, in which.

DETAILED DESCRIPTION OF EXEMPLARY EMBODIMENTS

Figure 1:
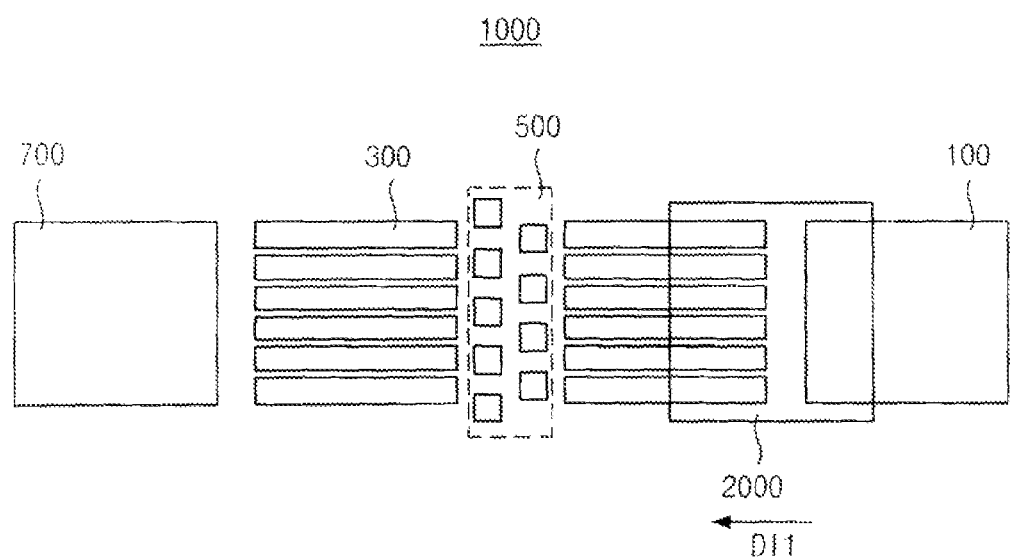
FIG. 1 is a plan view illustrating a substrate and an exposing apparatus according to an exemplary embodiment of the present invention.

The present invention is described more fully hereinafter with reference to the accompanying drawings, in which exemplary embodiments are shown. The present invention may, however, be embodied in many different forms and should not be construed as limited to exemplary embodiments set forth herein. Rather, exemplary embodiments are provided so that this disclosure will be thorough and complete, and will fully convey the scope of the present invention to those skilled in the art. In the drawings, the sizes and relative sizes of layers and regions may be exaggerated for clarity.

Hereinafter, exemplary embodiments of the present invention will be explained in detail with reference to the accompanying drawings.

Figure 2:
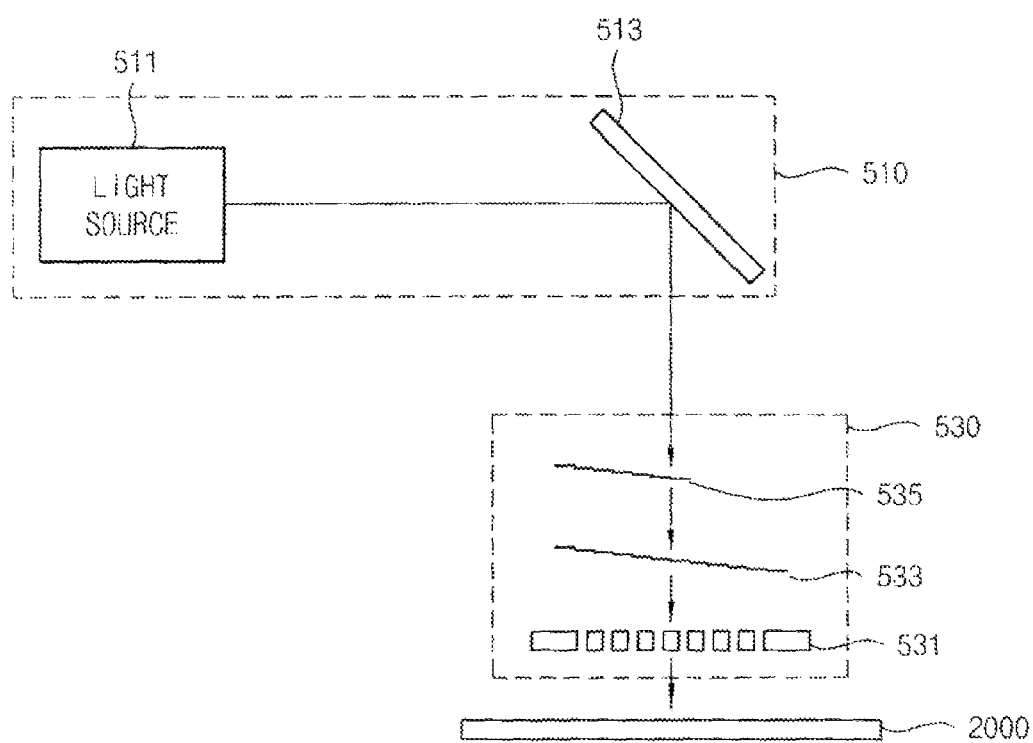
FIG. 2 is a schematic front view illustrating the substrate and an exposing part in FIG. 1.
Figure 3:
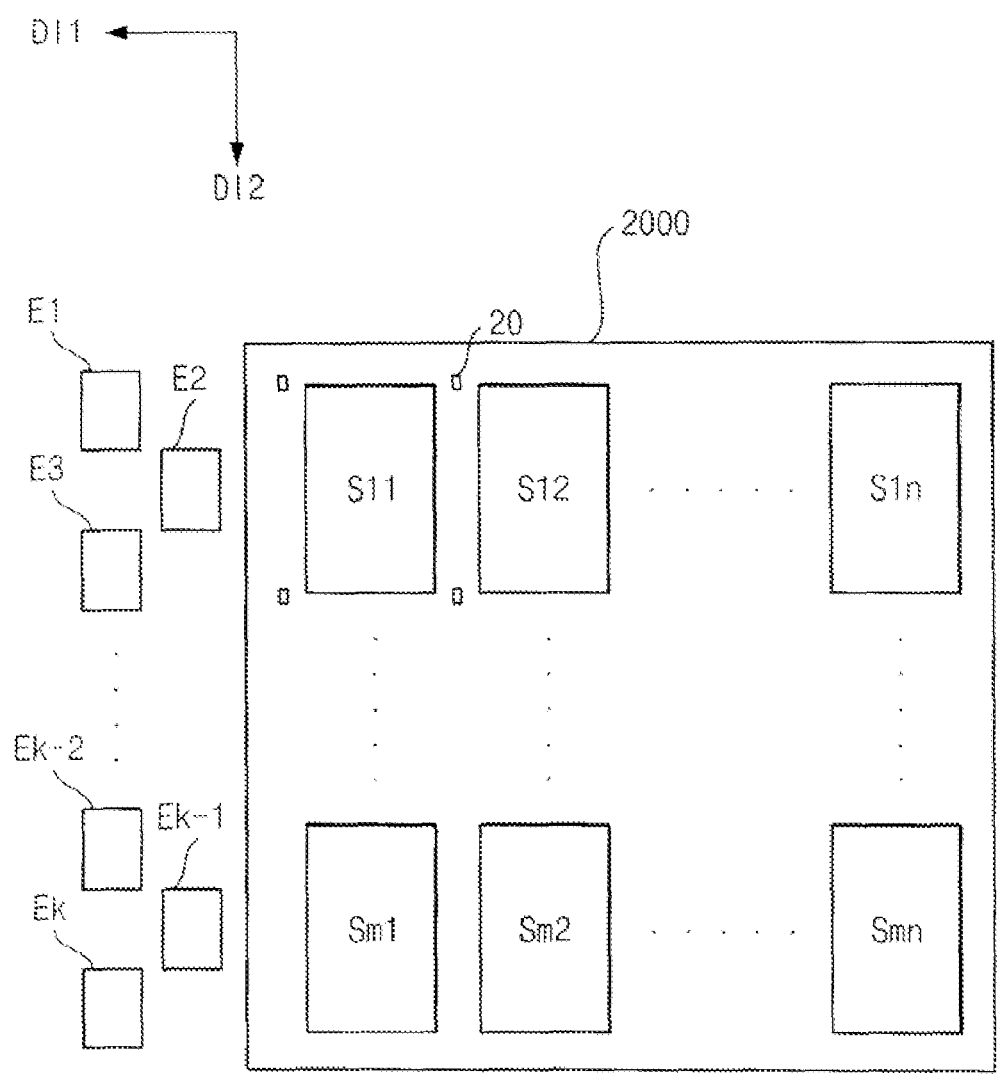
FIG. 3 is a plan view illustrating the substrate and the exposing part in FIG. 2.

FIG. 1 is a plan view illustrating a substrate and an exposing apparatus according to an exemplary embodiment of the present invention. FIG. 2 is a schematic front view illustrating the substrate and an exposing part in FIG. 1. FIG. 3 is a plan view illustrating the substrate and the exposing part in FIG. 2.

Referring to FIGS. 1 to 3, an exposing apparatus 1000 includes a loading part 100, a stage 300, an exposing part 500 and an unloading part 700.

The loading part 100 receives a substrate 2000 to be exposed.

The stage 300 transfers the substrate 2000 to be disposed under the exposing part 500 in a first direction DI1 so that the exposing part 500 exposes the substrate 2000.

The method of exposing the substrate includes a step exposing method or a scan exposing method. The step exposing method includes incrementally moving a substrate in the first direction DI1 and exposing portions of the substrate when stopped. The scan exposing method includes continuously exposing the substrate while the substrate is being transferred in the first direction DI1. For example, an island pattern may be formed using the step exposing method and a strip pattern may be formed using the scan exposing method.

The exposing part 500 includes a light source module 510 and an exposing module 530.

The light source module 510 irradiates first light towards the stage 300 through the exposing module 530. Thus, the first light from the light source module 510 is irradiated substantially perpendicular to a surface of the stage 300.

The light source module 510 includes a light source 511 and a concentrator 513.

The light source 511, for example, may include an Yttrium Aluminum Garnet (YAG) laser and a mercury lamp. A photoresist layer reacted with the first light is formed on the substrate 2000. In this case, the photoresist layer, for example, may include a photosensitive polymer composition.

The concentrator 513 concentrates the light from the light source 511. For aid in concentrating a sufficient amount of light, the concentrator 513 may include at least one reflective lens. The first light reflected by the concentrator 513 passes through the exposing module 530 and is irradiated to the substrate 2000, which is supported by the stage 300.

The substrate 2000 may be one of a Thin-Film Transistor (TFT) substrate and a color filter substrate, which are components of a Liquid Crystal Display (LCD) panel displaying an image in an LCD apparatus. The TFT substrate includes a TFT as a switching element. Multiple TFTs are arranged in a matrix pattern and a thin film shape is formed on a glass substrate. The color filter substrate includes a red color pixel, a green color pixel and a blue color pixel. The color pixels having thin film shapes are formed on a glass substrate.

The exposing module 530 includes a mask 531, a blocking shutter 533 and a transflective shutter 535.

The mask 531 is disposed over the substrate 2000, the blocking shutter 533 is disposed over the mask 531, and the transflective shutter 535 is disposed over the blocking shutter 533. Although not shown in the figure, the blocking shutter 533 may be disposed over the transflective shutter 535. In addition, the mask 531, the blocking shutter 533 and the transflective shutter 535 may be fixed by a frame.

The light source module 510 and the exposing module 530 are disposed above an exposed region when the substrate 2000 is divided into a plurality of regions. The regions are arranged in a matrix shape. For example, elements in a first row Sl1, Sl2, ..., Sln to an m-th row Sm1, Sm2, ..., Smn may represent the regions, where n and m are natural numbers.

In addition, when the substrate 2000 has a rectangular shape, the elements in the first row Sl1, Sl2, ..., Sln to the m-th row Sm1, Sm2, ..., Smn have rectangular shapes. Thus, the mask 531 may have a rectangular shape.

When the substrate 2000 is transferred in the first direction DI1, the light passing through the exposing module 530 including the mask 531 is irradiated to the first row Sl1, Sl2, ..., Sln to the m-th row Sm1, Sm2, ..., Smn of the substrate 2000. A plurality of exposure elements E1, E2, E3, ..., Ek-2, Ek-1 and Ek are arranged in a second direction DI2 substantially perpendicular to the first direction DI1. In this case, k is a natural number.

Each of the exposure elements E1, E2, E3, ..., Ek-2, Ek-1 and Ek includes the light source module 510 and the exposing module 530.

The plurality of exposure elements E1, E2, E3, ..., Ek-2, Ek-1 and Ek, for example, are arranged in two columns. For example, exposure elements of the first column arranged in the second direction DI2 and exposure elements of the second column adjacent to the first column in the second direction DI2 may be alternately disposed. The exposure elements may be arranged in the second direction DI2 in various forms.

The stage 300 transfers the substrate 2000 to be disposed under the exposing part 500. For example, the first row Sl1, Sl2, ..., Sln is exposed through the step exposing method or the scan exposing method over a first exposure element E1, a second exposure element E2 and a third exposure element E3, which are fixed by the frame. Similarly, the m-th row Sm1, Sm2, ..., Smn is exposed through the step exposing method or the scan exposing method over a (k-2)-th exposure element Ek-2, a (k-1)-th exposure element Ek-1 and a k-th exposure element Ek, which are fixed by the frame.

Therefore, each of the regions of the substrate 2000 arranged in the first direction DI1 is sequentially exposed so that a period for exposing the substrate 2000 may be decreased compared to a conventional exposing apparatus.

The exposing part 500, which is fixed, exposes the substrate 2000, which is transferred in the first direction DI1, and thus a pattern is formed on the substrate 2000 in a direction opposite to the first direction DI1.

In the present exemplary embodiment, the exposing part 500 is fixed, and the stage 300 transfers the substrate 2000 in the first direction DI1. However, the substrate 2000 may be fixed, and the stage 300 may transfer the exposing part 500 in the direction opposite to the first direction DI1. In this case, the mask 531, the blocking shutter 533 and the transflective shutter 535 may be transferred in the direction opposite to the first direction DI1 at the same time because the mask 531, the blocking shutter 533 and the transflective shutter 535 are fixed by the frame.

The pattern may be formed on the substrate 2000 in the direction opposite to the first direction DI1 when the exposing part 500 is transferred.

The substrate 2000 having been patterned may be taken out of the exposing apparatus 1000 through the unloading part 700.

Figure 4:
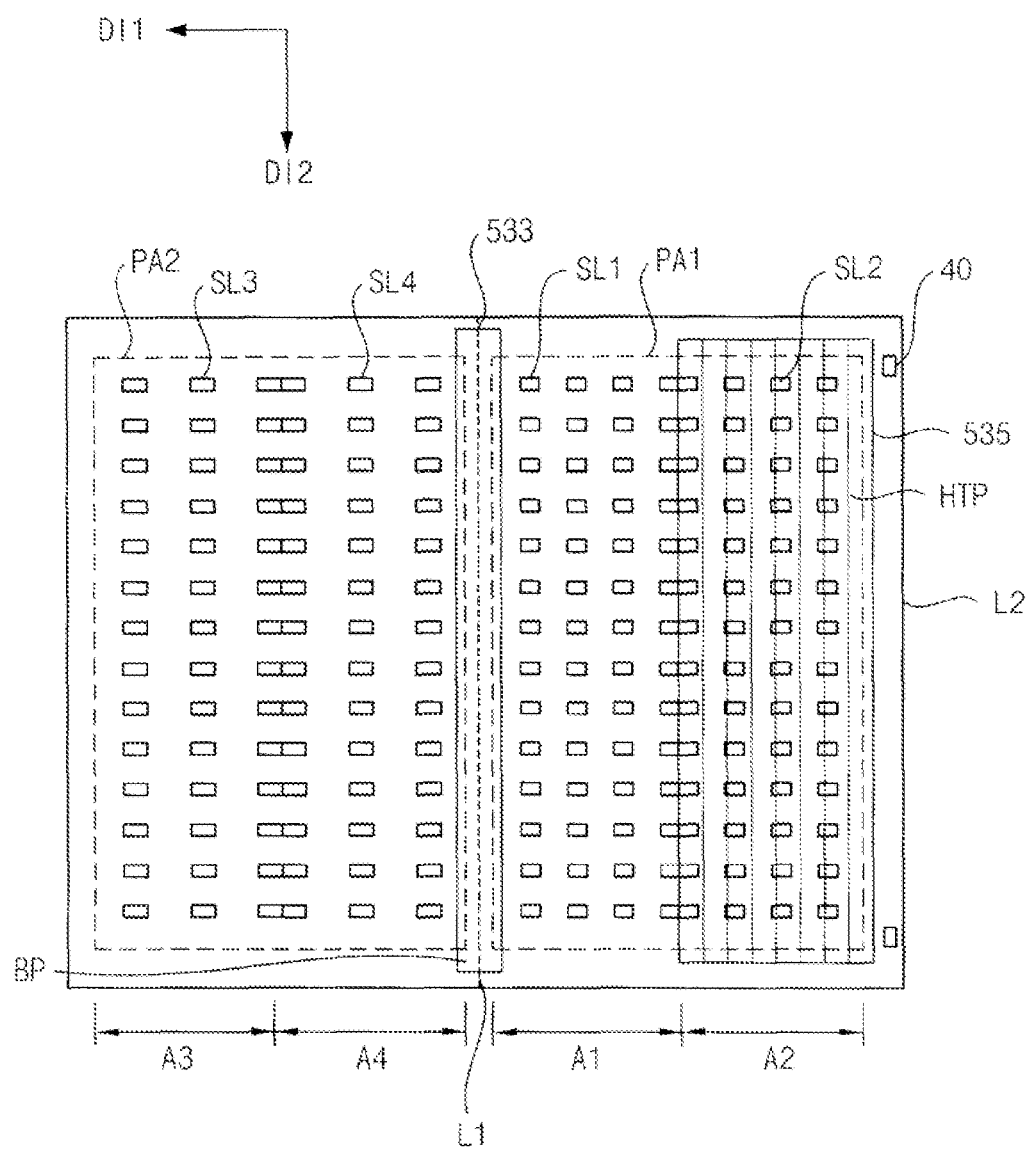
FIG. 4 is a plan view illustrating an exposing module in FIG. 2.

FIG. 4 is a plan view illustrating an exposing module in FIG. 2.

Referring to FIGS. 2 to 4, the exposing module 530 including the mask 531, the blocking shutter 533 and the transflective shutter 535 is disposed over the substrate 2000 during an exposing process.

At least two substrate alignment patterns 20 are formed on the substrate 2000 so that the substrate 2000 and the exposing part 500 may be accurately aligned.

A mask alignment pattern 40 corresponding to a substrate alignment pattern 20 is formed on the mask 531.

The substrate alignment pattern 20 includes an initial alignment pattern. A starting point for initiating the exposing process and a total size of the substrate 2000 may be identified from the initial alignment pattern before the exposing process is performed. Accordingly, the exposing process begins when the mask alignment pattern 40 and the initial alignment pattern are aligned.

The mask alignment pattern 40 is formed at an edge of the mask 531 to minimize interference due to slits included in the mask 531.

The mask alignment pattern 40 typically has a cross shape so that positions along the first direction DI1 and the second direction DI2 may be adjusted at the same time. The mask alignment pattern 40 is formed on the mask 531 when the slits are formed on the mask 531. Alternatively, the mask alignment pattern 40 may have a circular shape for patterning.

The substrate alignment pattern 20 including an opaque material is formed on the substrate 2000 when the photoresist layer is formed on the substrate 2000. The substrate alignment pattern 20 may be formed of the same material as the photoresist layer.

A size and a shape of the substrate alignment pattern 20 are respectively the same as the size and the shape of the mask alignment pattern 40.

Thus, the total size of the substrate 2000 and the starting point for initiating the exposing process may be identified before the exposing process is performed in the exposing part 500.

The mask 531 is divided into a first panel area PA1 and a second panel area PA2. The first panel area PA1 and the second panel area PA2 are formed on the mask 531 and are selectively used according to the size of a display panel corresponding to a region to be exposed. For example, the first panel area PA1 may be used in manufacturing a display panel of 20 inches, and the second panel area PA2 may be used in manufacturing a display panel of 40 inches.

For example, the light source module 510 provides the first light to the first panel area PA1 in manufacturing the display panel corresponding to the first panel area PA1, and the light source module 510 provides the first light to the second panel area PA2 in manufacturing the display panel corresponding to the second panel area PA2. Thus, display panels of different sizes may be manufactured using the mask 531.

The mask 531 may include slits for a rectangular pixel or a zigzag shaped pixel.

The first panel area PA1 includes a first area A1 and a second area A2. The first area A1 and the second area A2 respectively include first slits SL1 and second slits SL2. The amount of light for exposing a pattern on the substrate 2000 corresponding to the first area A1 and the amount of the light for exposing a pattern on the substrate 2000 corresponding to the second area A2 may be different from each other. In this case, the first slits SL1 and the second slits SL2 formed at a boundary portion between the first area A1 and the second area A2 are connected to each other.

The second panel area PA2 includes a third area A3 and a fourth area A4. The third area A3 and the fourth area A4 respectively include third slits SL3 and fourth slits SL4. The amount of light for exposing a pattern on the substrate 2000 corresponding to the third area A3 and the amount of the light for exposing a pattern on the substrate 2000 corresponding to the fourth area A4 may be different from each other. In this case, the third slits SL3 and the fourth slits SL4 formed at a boundary portion between the third area A3 and the fourth area A4 are connected to each other.

According to an exemplary embodiment of the present invention, the first light is irradiated to the first panel area PA1. The first light may also be irradiated to second panel area PA2 according to a size of a display panel.

In addition, the number of patterns of the mask 531 and the number of panel areas of the mask 531 may be adjusted according to the size of the display panel.

The blocking shutter 533 includes a plurality of blocking plates BP. Each of the blocking plates BP has a rectangular shape having a longitudinal side in the second direction DI2.

A disposition of the exposing module 530 is illustrated in FIG. 4 when the regions of the substrate 2000 corresponding to the first panel area PA1 are exposed by the exposing module 530.

For example, the light source module 510 over the exposing module 530 corresponding to the first panel area PA1 irradiates the first light to the region of the substrate 2000 to be exposed.

The blocking plates BP are folded and disposed over an edge portion of the first display area PA1. In FIG. 4, the blocking plates BP are folded and disposed close to a first line L1, which is a central line of the mask 531. The blocking plates BP may be folded and disposed close to a second line L2, which is a right edge of the mask 531.

The blocking plates BP are unfolded to partially cover the first panel area PA1 when the exposing module 530 is disposed over a region of the substrate 2000 not to be exposed.

For example, the blocking plates BP are unfolded to cover the first area A1 in areas close to left edges of the regions of the first row Sl1, Sl2, . . . , Sln to the m-th row Sm1, Sm2, . . . , Smn. The blocking plates BP are unfolded to cover the second area A2 in areas close to right edges of the regions of the first row Sl1, Sl2, . . . , Sln to the m-th row Sm1, Sm2, . . . , Smn.

The transflective shutter 535 may include, for example, molybdenum silicon (MoSi). An optical transmissivity of the transflective shutter 535 may be in a range between about 5% and about 95%. The transflective shutter 535 includes a plurality of transflective plates HTP. Each of the transflective plates HTP has a rectangular shape having a longitudinal side in the second direction DI2.

The transflective shutter 535 is disposed to cover the second slits SL2 so that the amount of light provided to the first slits SL1 in the first area A1 and the amount of light provided to the second slits SL2 in the second area A2 are different from each other when the exposing part 500 is disposed over the region of the substrate 2000 to be exposed.

Therefore, the first light is provided to the first slits SL1 and a second light is provided to the second slits SL2. In this case, the first light passes through the transflective shutter 535 to generate the second light.

The transflective plates HTP may be unfolded to cover the second area A2.

The transflective shutter 535 may be unfolded to cover the second area A2, and the transflective plates HTP of the transflective shutter 535 may be folded and disposed close to the edge portion, which is the first line L1 or the second line L2 of the mask 531, when the exposing module 530 is disposed over the region that is not to be exposed.

Figure 5A:
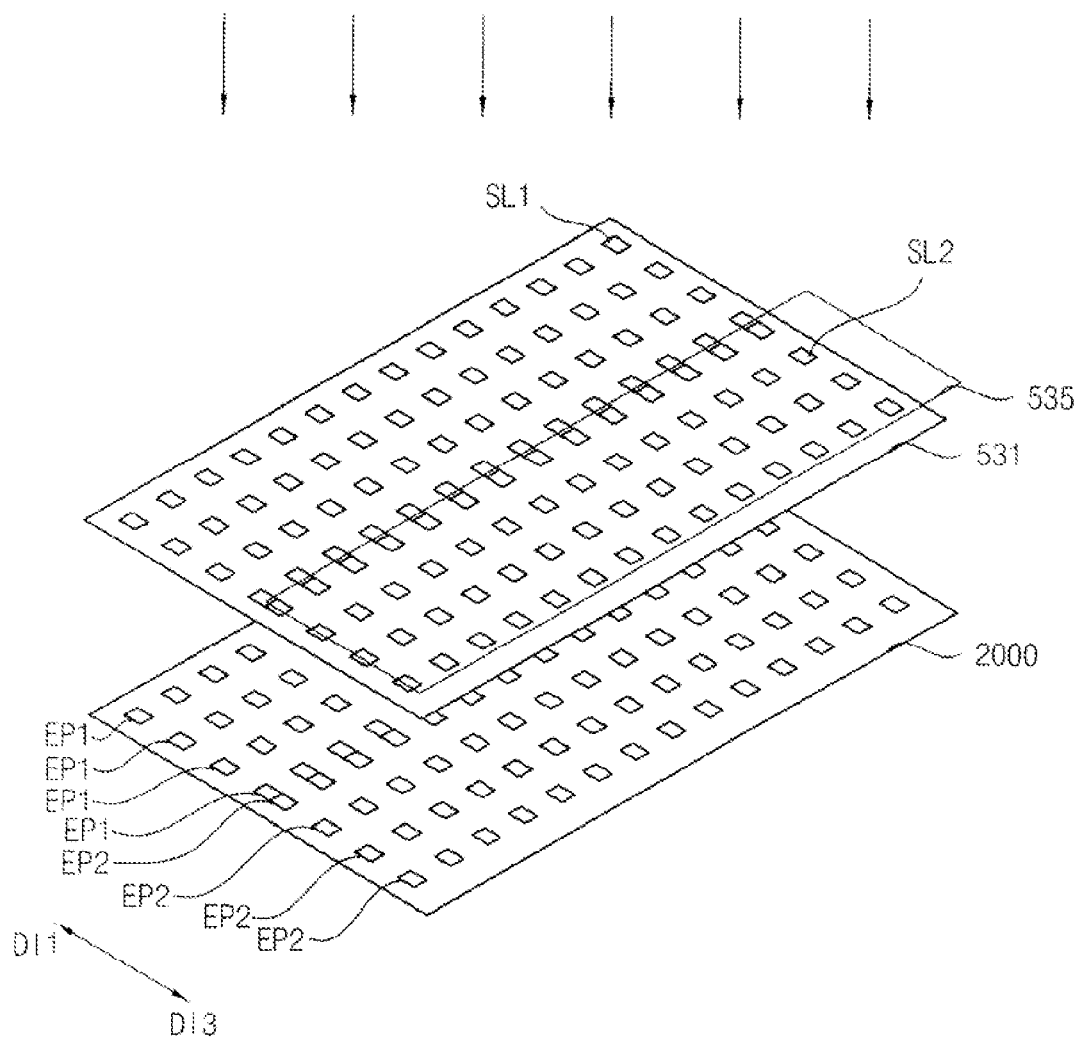
FIGS. 5A and 5B are perspective views illustrating the substrate, a mask and a transflective shutter for explaining a method of exposing the substrate in FIG. 2.
Figure 5B:
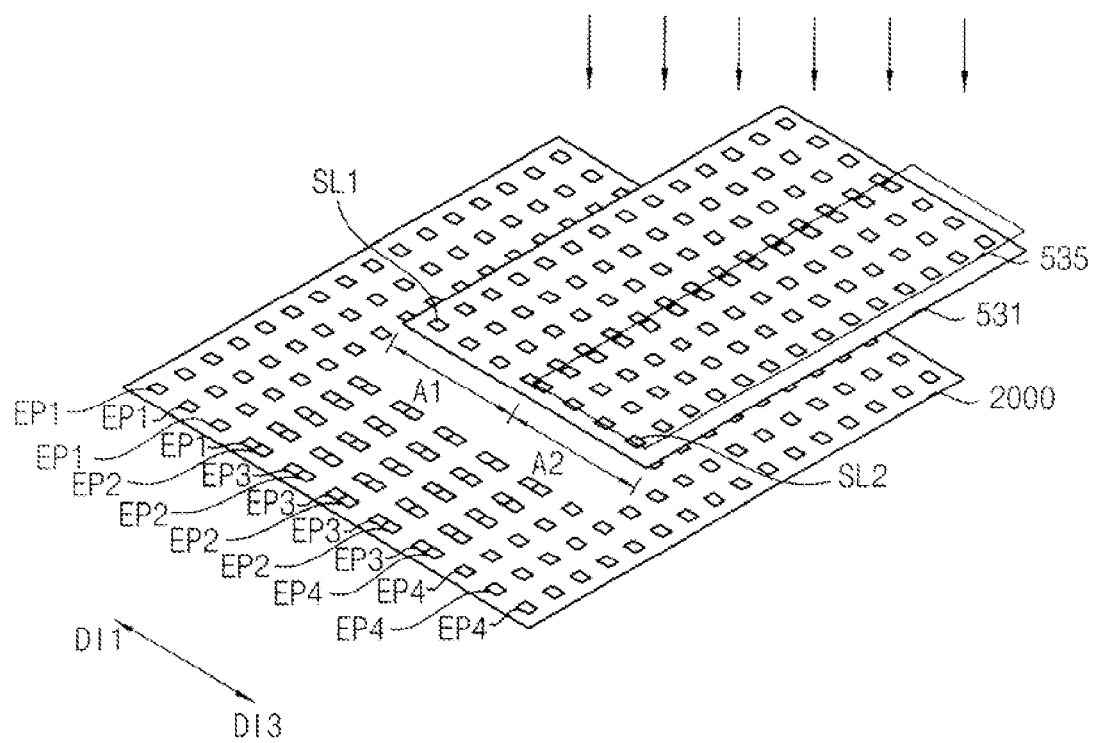

FIGS. 5A and 5B are perspective views illustrating the substrate, a mask and a transflective shutter for explaining a method of exposing the substrate in FIG. 2.

Referring to FIGS. 1, 2, 4 and 5A, the substrate 2000 is transferred under the exposing part 500 by the stage 300.

According to an exemplary embodiment of the present invention, the stage 300 transfers the substrate 2000 in the first direction DI1. Alternatively, the stage 300 may transfer the exposing part 500 in a third direction DI3 opposite to the first direction DI1.

The transflective shutter 535 is unfolded to cover the second area A2 of the mask 531 when the initial alignment pattern is aligned to the mask alignment pattern 40.

The light source module 510 then irradiates the first light to the exposing module 530. At this time, the first light is directly provided to the first slits SL1 of the mask 531. The first light passes through the transflective shutter 535 to generate the second light, and the second light is provided to the second slits SL2.

A first exposing pattern EP1 is formed on the substrate 2000 when the first light passing through the mask 531 is irradiated to the substrate 2000 in which the photoresist layer is formed. A second exposing pattern EP2 is formed on the substrate 2000 when the second light passing through the mask 531 is irradiated to the substrate 2000 in which the photoresist layer is formed.

The amount of the first light and the amount of the second light are different from each other so that thickness of the photoresist layer remaining in the first exposing pattern EP1 and thickness of the photoresist layer remaining in the second exposing pattern EP2 are different from each other after the photoresist layer of the substrate 2000 including the first exposing pattern EP1 and the second exposing pattern EP2 is etched. According to an exemplary embodiment of the present invention, the amount of the first light is greater than the amount of the second light.

For example, the photoresist layer on which the first exposing pattern EP1 and the second exposing pattern EP2 are not formed is removed when the photoresist layer is etched. In addition, the amount of the first light forming the first exposing pattern EP1 is greater than the amount of the second light forming the second exposing pattern EP2 so that the thickness of the photoresist layer remaining in the first exposing pattern EP1 is thicker than the thickness of the photoresist layer remaining in the second exposing pattern EP2.

Referring to FIGS. 2, 4 and 5B, the light source module 510 irradiates the first light to the exposing module 530 when the substrate 2000 is transferred in the first direction DI1 by a width of the first area A1 and the substrate alignment pattern 20 is aligned with the mask alignment pattern 40.

The first light passes through the first slits SL1 of the mask 531 in the first area A1, and sequentially passes through the transflective shutter 535 and second slits SL2 of the mask 531 at the second area A2.

A third exposing pattern EP3 is formed when the first light is irradiated to the substrate 2000 including a photoresist layer, and a fourth exposing pattern EP4 is formed when the second light is irradiated to the substrate 2000 including a photoresist layer.

The substrate 2000 is transferred in the first direction DI1 by the width of the first area A1 so that each of the third exposing patterns EP3 may be connected to each of the second exposing patterns EP2.

According to sizes of areas having a first thickness and a second thickness of a photoresist pattern which is patterned from the photoresist layer, width of the first slits SL1 and width of the second slits SL2 may be adjusted.

Therefore, width of the first to fourth exposing patterns EP1 to EP4 may be adjusted. The transflective shutter 535 may be differently unfolded according to the widths the first slits SL1 and the second slits SL2.

The patterns on the substrate 2000 are illustrated in FIGS. 5A and 5B when the first light is primarily and secondarily irradiated, respectively, after the exposing process is started. Alternatively, the exposing process may be performed until the first light is irradiated n times using substantially the same process illustrated in FIG. 3. In this case, the substrate 2000 may be transferred n times in the first direction DI1 via scanning when the first light is irradiated n times. Thus, the exposed regions of the first row Sl1, Sl2, . . . , Sln to the m-th row Sm1, Sm2, . . . , Smn may be exposed through the scan exposing method. According to an exemplary embodiment of the present invention, the scan exposing method is explained, however, alternatively the above-mentioned process may be applied in the step exposing method.

Although not shown in the figure, the blocking shutter 533 is disposed to partially cover the first panel area PA1 when the exposing module 530 is disposed over the region of the first panel area PA1 not to be exposed. For example, the blocking plates BP are unfolded to cover the first area A1 in areas close to the left edges of the regions of the first row Sl1, Sl2, . . . , Sln to the m-th row Sm1, Sm2, . . . , Smn. The blocking plates BP may be unfolded to cover the second area A2 in areas close to the right edges of the regions of the first row Sl1, Sl2, . . . , Sln to the m-th row Sm1, Sm2, . . . , Smn.

FIGS. 6A to 6G are cross-sectional views illustrating a method of manufacturing a display substrate using the exposing apparatus of the substrate in FIG. 1.

Figure 6A:
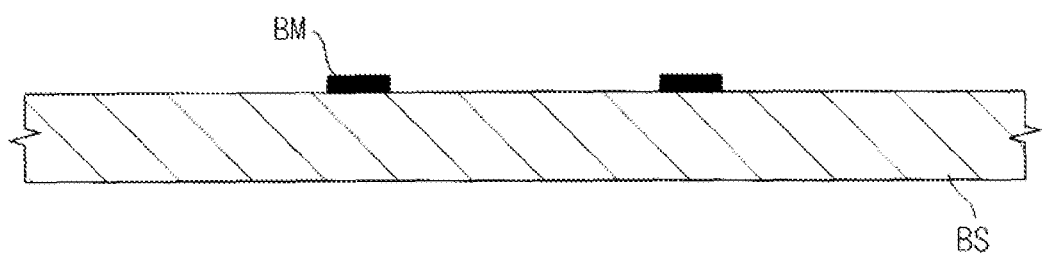
FIGS. 6A to 6G are cross-sectional views illustrating a method of manufacturing a display substrate using the exposing apparatus of the substrate in FIG. 1.
Figure 6B:
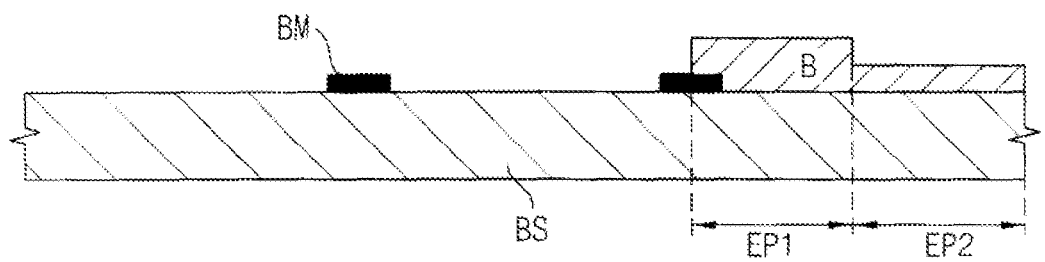
Figure 6C:
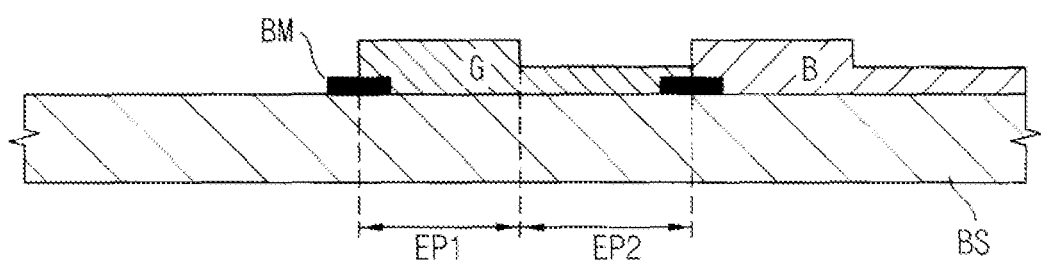
Figure 6D:
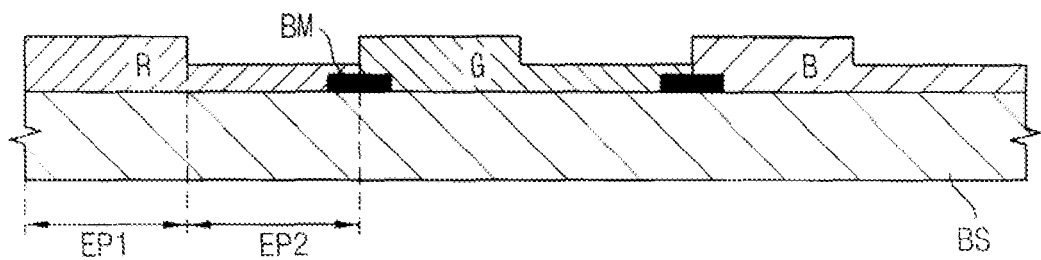
Figure 6E:
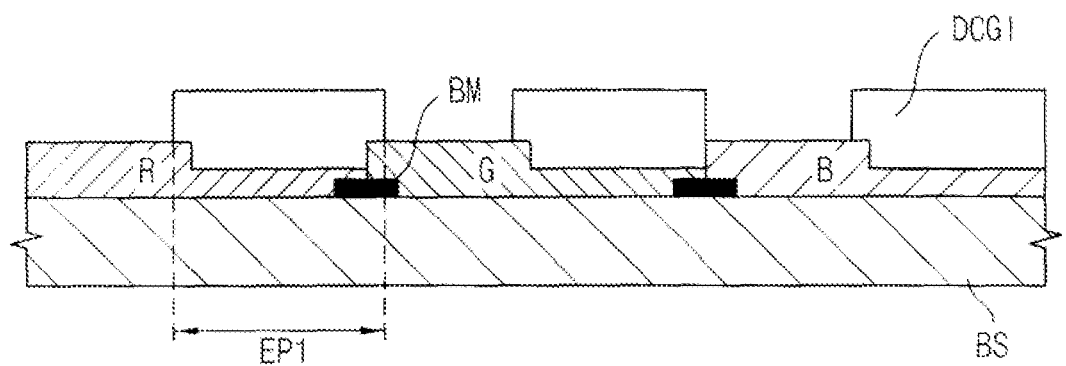
Figure 6F:
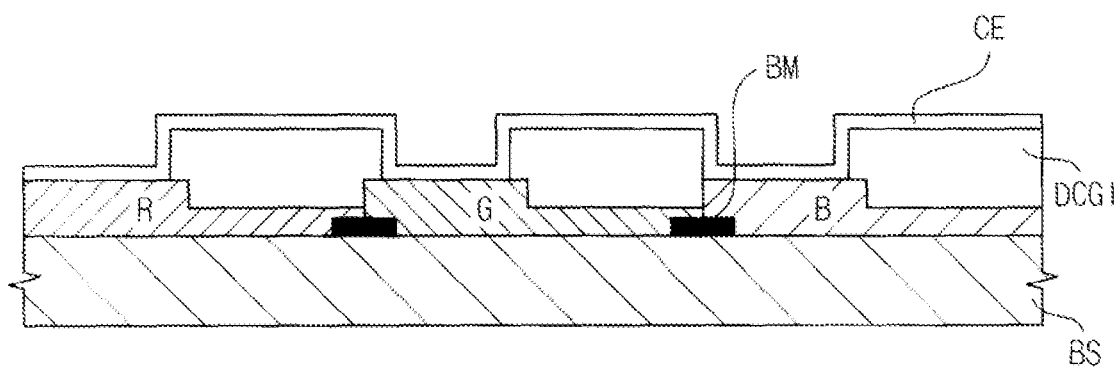

Referring to FIGS. 1 and 6A, a blocking pattern BM is formed on a substrate BS.

The substrate BS may be a transparent substrate including a transparent material such as quartz and so on. Light to a rear surface of the substrate BS passes through the substrate BS.

The blocking pattern BM is formed at a boundary portion between color filters. The color filters include red (R), green (G) and blue (B) color filters. The blocking pattern BM may include chromium (Cr). The blocking pattern BM blocks a light leakage between the color filters.

Referring to FIGS. 6A to 6D, a first color filter, a second color filter and a third color filter are formed on the substrate BS including the blocking pattern BM. For example, the color filters including the R, G and B color filters are formed. The first color filter, the second color filter and the third color filter are respectively formed by patterning a first color photoresist layer, a second color photoresist layer and a third color photoresist layer.

The R color filter, the G color filter and the B color filter may be sequentially formed or the B color filter, the G color filter and the R color filter may be sequentially formed, when the color filters are formed.

According to an exemplary embodiment of the present invention, the B color filter, the G color filter and the R color filter are sequentially formed on the substrate BS including the blocking pattern BM, for example.

Referring to FIGS. 1, 5A, 5B, 6A and 6B, a blue photoresist layer is formed on the substrate BS including the blocking pattern BM.

The B color filter is formed by patterning the blue photoresist layer through the exposing method illustrated in FIGS. 5A and 5B.

The amount of the first light forming the first exposing pattern EP1 is greater than the amount of the second light forming the second exposing pattern EP2. Thus, the thickness of the blue photoresist layer remaining in the first exposing pattern EP1 is thicker than the thickness of the blue photoresist layer remaining in the second exposing pattern EP2, and the blue photoresist layer where the first exposing pattern EP1 and the second exposing pattern EP2 are not formed is removed when the blue photoresist layer including the first exposing pattern EP1 and the second exposing pattern EP2 is etched. Thus, the B color filter having a stepped portion may be formed.

Referring to FIGS. 1, 5A, 5B, 6B and 6C again, a green photoresist layer is formed on the substrate BS including the B color filter.

The G color filter is formed by patterning the green photoresist layer through the exposing method illustrated in FIGS. 5A and 5B.

The amount of the first light forming the first exposing pattern EP1 is greater than the amount of the second light forming the second exposing pattern EP2. Thus, the thickness of the green photoresist layer remaining in the first exposing pattern EP1 is thicker than the thickness of the green photoresist layer remaining in the second exposing pattern EP2, and the green photoresist layer where the first exposing pattern EP1 and the second exposing pattern EP2 are not formed is removed when the green photoresist layer including the first exposing pattern EP1 and the second exposing pattern EP2 is etched. Thus, the G color filter having a stepped portion may be formed.

Referring to FIGS. 1, 5A, 5B, 6C and 6D, a red photoresist layer is formed on the substrate BS including the G color filter and the B color filter.

The R color filter is formed by patterning the red photoresist layer through the exposing method illustrated in FIGS. 5A and 5B.

The amount of the first light forming the first exposing pattern EP1 is greater than the amount of the second light forming the second exposing pattern EP2. Thus, the thickness of the red photoresist layer remaining in the first exposing pattern EP1 is thicker than the thickness of the red photoresist layer remaining in the second exposing pattern EP2, and the red photoresist layer where the first exposing pattern EP1 and the second exposing pattern EP2 are not formed is removed when the red photoresist layer including the first exposing pattern EP1 and the second exposing pattern EP2 is etched. Thus, the R color filter having a stepped portion may be formed.

Referring to FIGS. 1, 5A, 5B, 6D and 6E, an insulation photoresist layer is formed on the substrate BS including the RGB color filters for forming a double-cellgap insulation layer DCGI. The double-cellgap insulation layer DCGI may include an organic material or an inorganic material, such as silicon nitride (SiNx), silicon oxide (SiOx), etc.

The double-cellgap insulation layer DCGI is formed by patterning the insulation photoresist layer through the exposing method illustrated in FIGS. 5A and 5B.

At this time, the transflective shutter 535 is folded and disposed close to the first line L1 or the second line L2 as not to overlap with the first slits SL1 and the second slits SL2. Thus, the first exposing pattern EP1 and the second exposing pattern EP2 may be exposed with a substantially same amount of light.

Therefore, the insulation photoresist layer remaining in which the first exposing pattern EP1 and the second exposing pattern EP2 are formed is partially etched and the insulation photoresist layer remaining in which the first and second exposing patterns EP1 and EP2 are not formed is entirely removed, when the insulation photoresist layer including the first exposing pattern EP1 and the second exposing pattern EP2 is etched.

In addition, the blocking shutter 533 covers the second area A2 so that the first exposing pattern EP1 may be only formed on the insulation photoresist layer.

Therefore, the insulation photoresist layer on which the first exposing pattern EP1 is formed is partially etched and the insulation photoresist layer on which the first exposing pattern EP1 is not formed is entirely removed, when the insulation photoresist layer including the first exposing pattern EP1 is etched.

Accordingly, the double-cellgap insulation layer DCGI having the stepped portion may be partially formed.

Referring to FIGS. 1, 5A, 5B, 6E and 6F again, a common electrode CE, which is a transparent electrode, is formed on the substrate BS including the double-cellgap insulation layer DCGI, and a column spacer CS is formed on the substrate BS including the common electrode CE.

A method of manufacturing the column spacer CS is substantially the same as the method of manufacturing the double-cellgap insulation layer DCGI, and thus any further explanation will be omitted.

The block matrix BM on the substrate BS may be replaced with the substrate alignment pattern 20 in the method of manufacturing the color filters, the double-cellgap insulation layer DCGI and the column spacer CS as illustrated in FIGS. 6B to 6G.

Figure 6G:
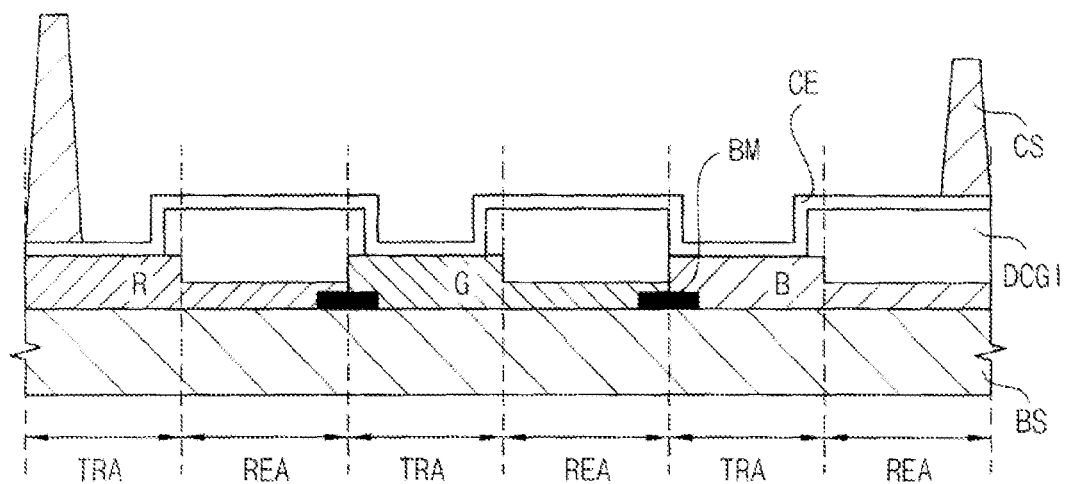

A display substrate 3000, which is a color filter substrate in FIG. 6G, may be used in a transflective display panel. For example, the color filter in a transmissive area TRA may be thicker than that in a reflective area REA, and the double-cellgap insulation layer DCGI may be formed only in the reflective area REA.

A display substrate including a multi-layered stepped portion having various shapes, and a transflective display apparatus having the display substrate may be manufactured using the exposing apparatus 1000 according to an exemplary embodiment of the present invention. Although not shown in the figure, an insulation layer of a TFT substrate combined with the color filter substrate may be diversely formed to have the stepped portion.

According to an exemplary embodiment of the present invention, an amount of light irradiated to the substrate 2000 may be adjusted without manufacturing a slit mask or a half-tone mask by disposing the transflective shutter 535 over the mask 531 when the display substrate having the stepped portion is manufactured.

According to some exemplary embodiments of the present invention, an amount of light irradiated to a substrate may be adjusted per area by disposing a transflective shutter over a mask of an exposing apparatus. Therefore, a manufacturing step for a slit mask or a half-tone mask is not needed when a display substrate having the stepped portion according to a transmissive area and a reflective area of a transflective display apparatus is manufactured.

The foregoing is illustrative of the present invention and is not to be construed as limiting thereof. Although exemplary embodiments of the present invention have been described, those skilled in the art will readily appreciate that many modifications are possible in exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present invention is defined by the following claims, with equivalents of the claims to be included therein.

What is claimed is:

1. A method of exposing a substrate, the method comprising:
    exposing a photoresist layer exposed through first slits of a mask using first light; and
    exposing the photoresist layer through second slits of the mask using second light, the first light passing through a transflective shutter to generate the second light.

2. The method of claim 1, further comprising transferring the substrate in a first direction, so that the substrate is disposed under the mask and an alignment pattern of the mask is aligned with an initial alignment pattern of the substrate.

3. The method of claim 1, further comprising unfolding blocking plates of a blocking shutter disposed over the mask to selectively block the first slit and the second slit corresponding to a region of the substrate to be unexposed.

4. The method of claim 3, wherein the blocking plates are folded to expose the first slit and the second slit corresponding to a region of the substrate to be exposed.

5. The method of claim 1, wherein the transflective shutter includes a plurality of transflective plates, each of the transflective plates has a longitudinal side along a second direction substantially perpendicular to the first direction, and the transflective plates are unfolded.

6. The method of claim 1, further comprising transferring the mask and the transflective shutter together in an exposing direction, so that the substrate is disposed under the mask and an alignment pattern of the mask is aligned with an initial alignment pattern of the substrate.

7. An apparatus for exposing a substrate, the apparatus comprising:
    a mask including first slits and second slits, the mask disposed over the substrate having a photoresist layer formed on the substrate;
    a transflective shutter disposed over the second slits of the mask, and partially transmitting first light to generate second light; and
    a stage for changing a position of the substrate with respect to the mask.

8. The apparatus of claim 7, wherein the stage transfers the substrate in a first direction to dispose the substrate under the mask.

9. The apparatus of claim 7, wherein the transflective shutter includes a plurality of transflective plates connected to each other, and each of the transflective plates has a longitudinal side in a second direction substantially perpendicular to the first direction.

10. The apparatus of claim 7, wherein a transmissivity of the transflective shutter is in a range between about 5% and about 95%.

11. The apparatus of claim 7, further comprising a blocking shutter disposed between the transflective shutter and the mask to selectively block the first light and the second light.

12. The apparatus of claim 11, wherein the blocking shutter includes a plurality of blocking plates connected to each other, and each of the blocking plates has a longitudinal side in a second direction substantially perpendicular to the first direction.

13. The apparatus of claim 7, wherein the mask includes a first area in which the first slits are formed and a second area in which the second slits are formed, and each of the first slits and each of the second slits in a boundary portion between the first and second areas are connected to each other.

14. The apparatus of claim 13, wherein the mask includes a third area in which third slits are formed and a fourth area in which fourth slits are formed, a size of the third slit is different from a size of the first slit, a size of the fourth slit is different from a size of the second slit, and each of the third slits and each of the fourth slits in a boundary portion between the third and fourth areas are connected to each other.

15. The apparatus of claim 7, wherein the mask includes an alignment pattern corresponding to an alignment pattern of the substrate to align the mask and the substrate.

16. The apparatus of claim 7, wherein the stage transfers the mask and the transflective shutter in an exposing direction to dispose the substrate under the mask.

17. A method of manufacturing a display substrate, the method comprising:
    forming a blocking pattern on a substrate including a reflective area and a transmissive area;
    forming a color photoresist layer on the substrate having the blocking pattern formed on the substrate;
    exposing the color photoresist layer in the transmissive area using first light, and exposing the color photoresist layer in the reflective area using second light, to form a color filter having different thickness in the reflective area and in the transmissive area, respectively, the first light passing through a transflective shutter to generate the second light and the first light and the second light passing through respective slits of a mask; and forming a transparent electrode on the substrate having the color filter formed on the substrate.

18. The method of claim 17, further comprising exposing the substrate at different positions of the substrate with respect to the slits of the mask.

19. The method of claim 18, wherein a blocking shutter is partially open or closed to selectively block the first light and the second light corresponding to a region of the substrate to be unexposed.

20. The method of claim 17, further comprising aligning an alignment pattern of the mask with the blocking pattern of the substrate when exposing the substrate.

* * * * *